(12) United States Patent
Shiraishi

(10) Patent No.: US 10,224,871 B1
(45) Date of Patent: Mar. 5, 2019

(54) QUADRATURE OSCILLATION CIRCUIT AND CDR CIRCUIT

(71) Applicant: FUJITSU LIMITED, Kawasaki-shi, Kanagawa (JP)

(72) Inventor: Takashi Shiraishi, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/053,178

(22) Filed: Aug. 2, 2018

(30) Foreign Application Priority Data

Aug. 18, 2017 (JP) .................................. 2017-158175

(51) Int. Cl.
*H04B 10/00* (2013.01)
*H03B 5/12* (2006.01)
(Continued)

(52) U.S. Cl.
CPC ........... *H03B 5/1209* (2013.01); *H03L 7/099* (2013.01); *H04B 10/2507* (2013.01);
(Continued)

(58) Field of Classification Search
CPC .............. H04B 10/2507; H04B 10/516; H04B 10/548; H04B 10/5561; H04B 10/50597; H03B 5/124; H03B 5/1212; H03B 5/1221; H03B 5/1296; H03B 5/1271; H03B 5/1237
USPC ....... 398/154, 155, 182, 183, 188, 192, 193, 398/194, 158, 159, 163, 140; 331/167, 331/117 R, 45, 46, 50, 55
See application file for complete search history.

(56) References Cited

U.S. PATENT DOCUMENTS

| 6,456,167 B1 * | 9/2002 | Huang | H03B 27/00 331/117 FE |
| 7,595,700 B2 * | 9/2009 | Byun | H03B 27/00 331/117 R |

(Continued)

FOREIGN PATENT DOCUMENTS

| JP | 2011-49975 | 3/2011 |
| JP | 2011-509038 | 3/2011 |

OTHER PUBLICATIONS

T. Shibasaki, et. al., "4x25.78Gb/s Retimer ICs for Optical Links in 0.13 micrometre SiGe BiCMOS", ISSCC 2015 / Session 22 / High-Speed Optical Links / 22.7, pp. 412-414 (3 pages), 2015.

*Primary Examiner* — Hanh Phan
(74) *Attorney, Agent, or Firm* — Fujitsu Patent Center

(57) ABSTRACT

A quadrature oscillation circuit includes a plurality of adjacent quadrature oscillators, wherein a first quadrature oscillator includes a first I-phase inductor, a first Q-phase inductor, and a first drive circuit that generates a first I-phase current passing the first I-phase inductor and a first Q-phase current passing the first Q-phase inductor such that phases of a first I-phase differential signal from the first I-phase inductor are different from phases of a first Q-phase differential signal from the first Q-phase inductor, a second quadrature oscillator includes a second I-phase inductor, a second Q-phase inductor, and a second drive circuit that generates a second I-phase current passing the second I-phase inductor and a second Q-phase current passing the second Q-phase inductor such that phases of a second I-phase differential signal from the second I-phase inductor are different from phases of a second Q-phase differential signal from the second Q-phase inductor.

8 Claims, 16 Drawing Sheets

(51) Int. Cl.
  *H03L 7/099* (2006.01)
  *H04L 7/033* (2006.01)
  *H04B 10/2507* (2013.01)
  *H04B 10/61* (2013.01)
  *H04L 7/00* (2006.01)
  *H04B 10/556* (2013.01)
  *H03L 7/087* (2006.01)
  *H03L 7/093* (2006.01)

(52) U.S. Cl.
  CPC ....... *H04B 10/5561* (2013.01); *H04B 10/613* (2013.01); *H04B 10/6165* (2013.01); *H04L 7/0075* (2013.01); *H04L 7/0331* (2013.01); *H03B 5/1228* (2013.01); *H03B 5/1231* (2013.01); *H03B 2200/0078* (2013.01); *H03L 7/087* (2013.01); *H03L 7/093* (2013.01)

(56) References Cited

U.S. PATENT DOCUMENTS

| | | |
|---|---|---|
| 2011/0032044 A1 | 2/2011 | Lee et al. |
| 2011/0050354 A1 | 3/2011 | Hirashiki et al. |

\* cited by examiner

QUADRATURE OSCILLATION CIRCUIT AND CDR CIRCUIT

CROSS-REFERENCE TO RELATED APPLICATION

This application is based upon and claims the benefit of priority of the prior Japanese Patent Application No. 2017-158175, filed on Aug. 18, 2017, the entire contents of which are incorporated herein by reference.

FIELD

The embodiments discussed herein are related to a quadrature oscillation circuit and a clock and data recovery (CDR) circuit.

BACKGROUND

A quadrature oscillator that uses LC resonators, each consisting of an inductor (L) and a capacitor (C) connected in parallel, to produce four-phase clocks of different phases by LC resonance is known. Quadrature oscillators are used, for example, in CDR circuits that are used for the high-speed interconnection for sending and receiving high-speed data by wired or wireless communication. CDR circuits recover clocks and data from a data signal in which the clocks are superimposed.

If quadrature oscillators are adjacent to each other, however, the configuration may cause crosstalk between the inductors of the adjacent quadrature oscillators and thus it is difficult to shorten the pitches between the quadrature oscillators. The crosstalk problem may hinder further size reduction in the circuits.

The following is a reference document.
[Document 1] T. Shibasaki, et. al., "4×25. 78 Gb/s Retimer ICs for Optical Links in 0.13 µm SiGe BiCMOS", ISSCC, 2015.

SUMMARY

According to an aspect of the invention, a quadrature oscillation circuit includes a plurality of adjacent quadrature oscillators, wherein a first quadrature oscillator in the quadrature oscillators includes a first I-phase inductor, a first Q-phase inductor, and a first drive circuit that generates a first I-phase current passing through the first I-phase inductor and a first Q-phase current passing through the first Q-phase inductor such that phases of a first I-phase differential signal output from both sides of the first I-phase inductor and phases of a first Q-phase differential signal output from both sides of the first Q-phase inductor are different from each other, a second quadrature oscillator in the quadrature oscillators includes a second I-phase inductor, a second Q-phase inductor, and a second drive circuit that generates a second I-phase current passing through the second I-phase inductor and a second Q-phase current passing through the second Q-phase inductor such that phases of a second I-phase differential signal output from both sides of the second I-phase inductor and phases of a second Q-phase differential signal output from both sides of the second Q-phase inductor are different from each other, and the second drive circuit generates the second Q-phase current whose phase is inversed with respect to the phase of the first Q-phase current when the first I-phase current and the second I-phase current are in phase, and generates the second I-phase current whose phase is inversed with respect to the phase of the first I-phase current when the first Q-phase current and the second Q-phase current are in phase.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, a quadrature oscillation circuit and a CDR circuit according to an embodiment will be described with reference to the attached drawings.

Figure 1:
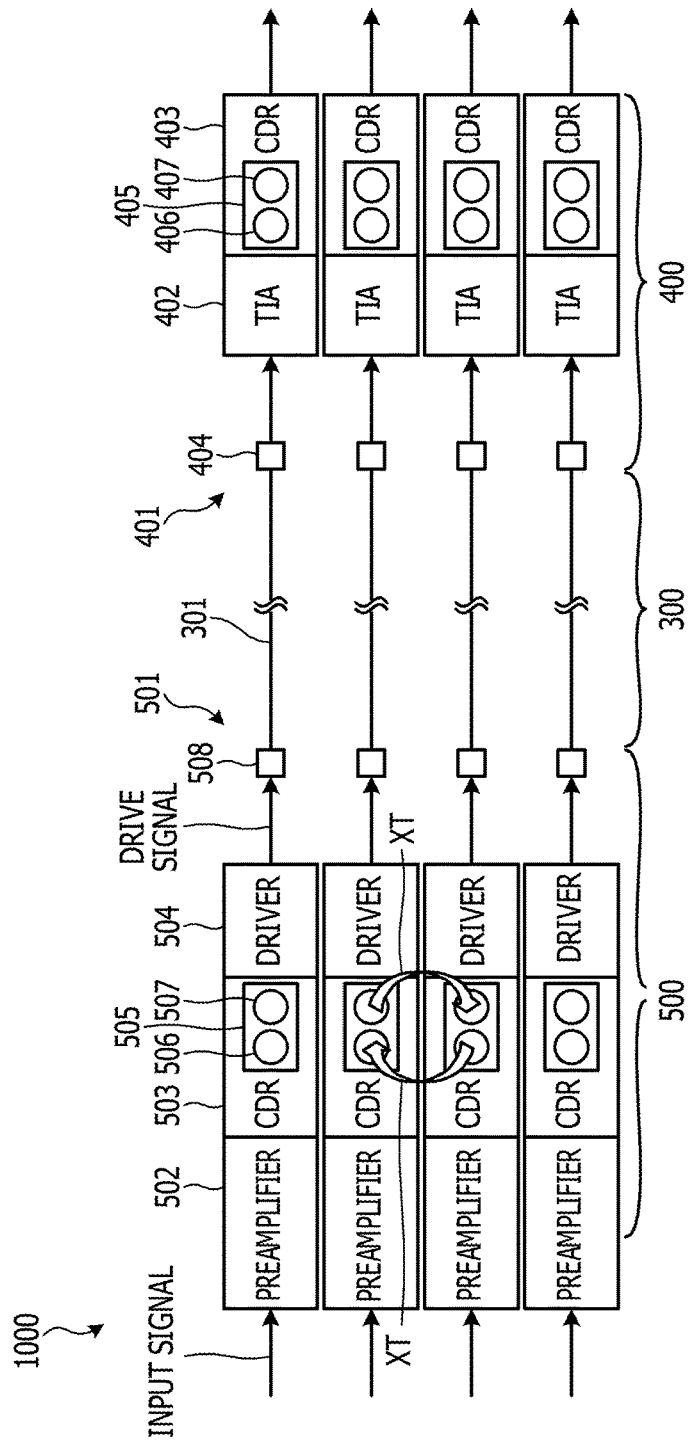
FIG. 1 illustrates an exemplary configuration of an optical communication system that uses a CDR circuit according to an embodiment.

FIG. 1 illustrates an exemplary configuration of an optical communication system that uses a CDR circuit according to an embodiment. An optical communication system 100 includes a send circuit 500 that converts an input signal into an output signal and outputs the signal, an optical fiber 300 that transmits the optical signal from the send circuit 500, and a receive circuit 400 that receives the optical signal and recovers the received signal. The send circuit 500 recovers an input signal sent from an electronic device or other devices to generate an optical signal. The send circuit 500 may be a relaying device that receives an optical signal via the optical fiber 300, converts the optical signal into an electrical signal, converts the electrical signal back into an optical signal, and outputs the signal. The receive circuit 400 outputs a recovered received signal to an electronic device or other devices as an electrical signal. The receive circuit 400 may be a relaying device that converts a received signal back into an optical signal and outputs the signal.

The send circuit 500 includes a plurality of send sections 501. Each send section 501 includes a preamplifier 502, a CDR section 503, a driver 504, and a light emitting element 508. The CDR section 503 recovers clocks from a data signal, which is an input signal amplified by the preamplifier 502, with four-phase clocks generated by a quadrature oscillator 505 and recovers the transmitted data signal. The CDR section 503 includes a quadrature oscillator 505 that includes an I-phase inductor 506 and a Q-phase inductor 507 to be used for four-phase clock generation. The driver 504 outputs a drive signal for driving the light emitting element 508 in accordance with a transmitted data signal, generates an optical signal by using the light emitting element 508, and outputs the optical signal to the fiber line 301. Specific examples of the light emitting element 508 include a laser diode.

The optical fiber 300 includes a plurality of fiber lines 301. The respective fiber lines 301 connect between the send sections 501 and receive sections 401.

The receive circuit 400 includes a plurality of receive sections 401. Each respective receive section 401 includes a photoreceptor 404, a transimpedance amplifier (TIA) 402, and a CDR section 403. The photoreceptor 404 converts an optical signal received via the fiber line 301 of the optical fiber 300 into an electrical received data signal. Specific examples of the photoreceptor 404 include a photodiode. The TIA 402 amplifies a received data signal. The CDR section 403 recovers clocks and a received data signal from a received data signal with four-phase clocks generated by the quadrature oscillator 405. The CDR section 403 includes a quadrature oscillator 405 that includes an I-phase inductor 406 and a Q-phase inductor 407 to be used for four-phase clock generation.

The CDR circuit according to the embodiment may be applied to a CDR circuit that includes a plurality of CDR sections 503 and a CDR circuit that includes a plurality of CDR sections 403. The quadrature oscillation circuit according to the embodiment may be applied to a quadrature oscillation circuit that includes adjacent quadrature oscillators 505 and a quadrature oscillation circuit that includes adjacent quadrature oscillators 405.

The use of the quadrature oscillation circuit and the CDR circuit according to the embodiment is not limited to the optical communication system. For example, the quadrature oscillation circuit and the CDR circuit according to the embodiment may be applied to any circuit that sends and receives a data signal that has been modulated in synchronization with a clock in an electronic device or outside an electronic device as long as the clock is recovered from the data signal. For example, the quadrature oscillation circuit and the CDR circuit according to the embodiment may be used in fields where further increase in bit rate is desired, such as the field of high-speed interconnection in which signals are sent and received within an integrated circuit chip or between chips (within a device or between devices).

In multi-channel high-speed interconnection in which a plurality of four-phase clock signals are used, the interference (crosstalk (XT)) between adjacent inductors may affect CDR characteristics. Furthermore, in a high frequency range of about 25 GHz, an I-phase inductor and a Q-phase inductor in a quadrature oscillator occupy a relatively large area in the circuit of the quadrature oscillator. Consequently, it is difficult to narrow the pitch between adjacent send sections 501 or the pitch between adjacent receive sections 401, and thus the size of the send circuit 500 or the receive circuit 400 may not be further reduced.

Figure 2:
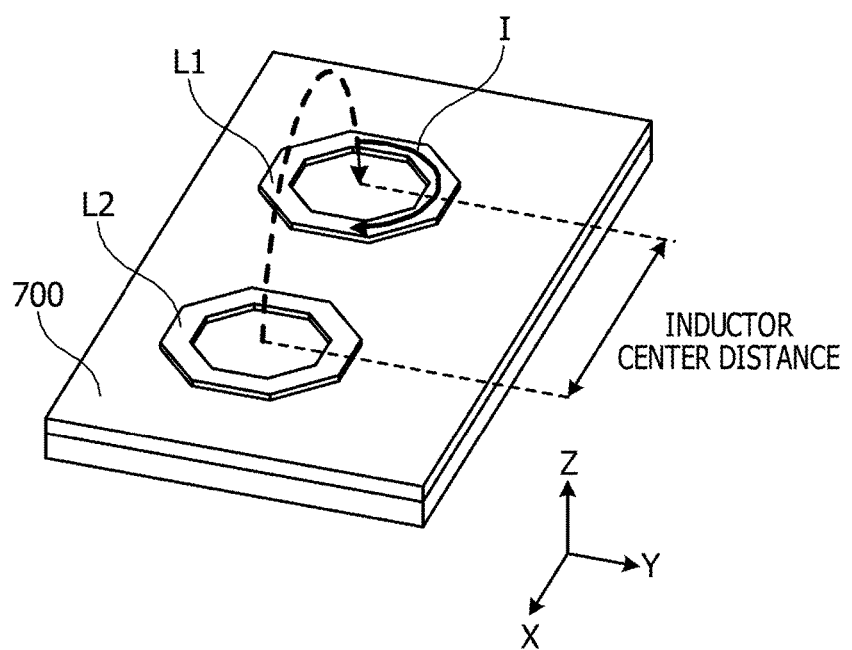
FIG. 2 illustrates interference between inductors.

FIG. 2 illustrates interference between adjacent inductors. Inductors L1 and L2 are disposed in parallel with each other on an XY plane such that the axis directions are in parallel with a Z axis, specifically, disposed on a substrate 700. For example, the inductor L1 is a Q-phase inductor that is disposed on one quadrature oscillator in adjacent quadrature oscillators, and the inductor L2 is a Q-phase inductor that is disposed on the other quadrature oscillator. In another example, the inductor L1 is an I-phase inductor that is disposed on one quadrature oscillator in adjacent quadrature oscillators, and the inductor L2 is an I-phase inductor that is disposed on the other quadrature oscillator. The substrate 700 may be separated substrates: a substrate on which the inductor L1 is disposed and a substrate on which the inductor L2 is disposed.

Through the circular inductors L1 and L2, electric currents pass respectively. A magnetic field generated by the electric current passing through the one inductor L2 extends through the other inductor L1, generating a magnetic field coupling through which an induced current I passes through. The magnetic field coupling is one of the causes of crosstalk that occurs between the inductor L1 and the inductor L2.

Figure 3:
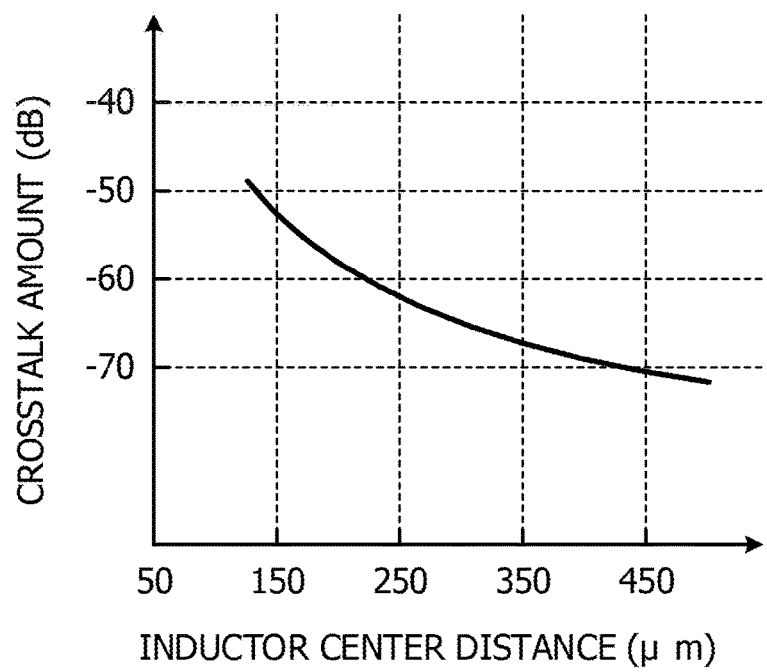
FIG. 3 illustrates an exemplary relationship between an inductor center distance and a crosstalk amount.

FIG. 3 illustrates an example result of a simulation of a relationship between an inductor center distance and a crosstalk amount. An inductor center distance is a distance between a center of the inductor L1 and a center of the inductor L2. For example, in a quadrature oscillator that generates a four-phase clock of 25 GHz, when an inductor center distance is 250 μm, an amount of crosstalk between inductors is about −64 dB. If the inductor center distance is further reduced, however, the crosstalk amount increases, and thus the CDR characteristics will be affected.

To solve the problem, in adjacent quadrature oscillators, when the electric currents passing through inductors of one of an I-phase and a Q-phase are in phase, the phases of electric currents passing through the inductors of the other phase are changed such that the phases of the electric currents becomes opposite to each other to reduce the interference between the inductors in phase. Reducing the interference between the adjacent inductors in phase enables further reduction in the inductor center distance. Accordingly, the size of the quadrature oscillation circuit having a plurality of adjacent quadrature oscillators will be reduced.

Next, the quadrature oscillation circuit according to the embodiment will be further described in detail.

Figure 4:
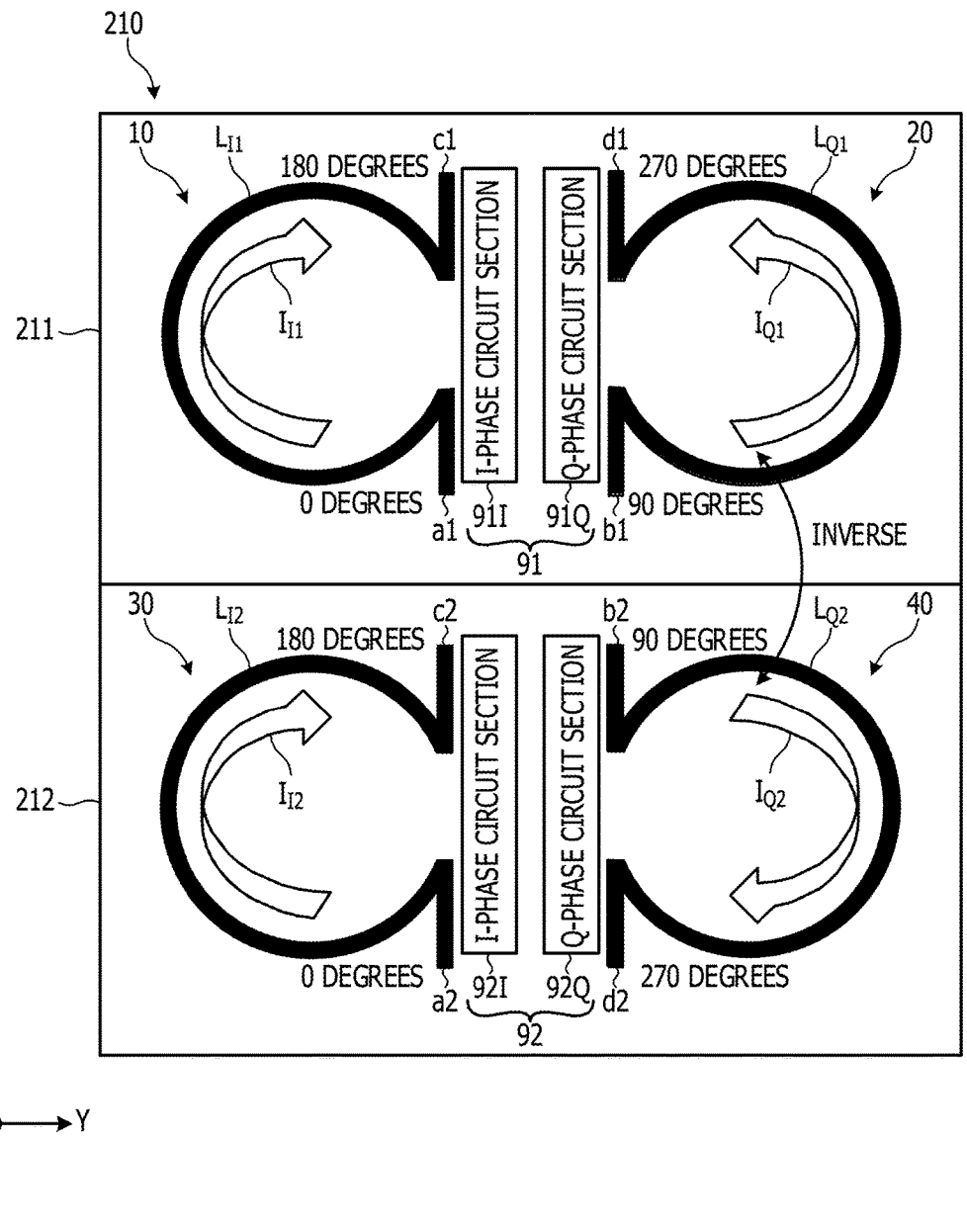
FIG. 4 illustrates an exemplary configuration of a quadrature oscillation circuit.

FIG. 4 schematically illustrates an example configuration of a quadrature oscillation circuit according to the embodiment. A quadrature oscillation circuit 210 in FIG. 4 includes adjacent two quadrature oscillators 211 and 212. For example, the first quadrature oscillator 211 is used to send and receive data with the fiber line 301 on a communication channel 1, and the second quadrature oscillator 212 is used to send and receive data with the fiber line 301 on a communication channel 2. The quadrature oscillators 211 and 212 are disposed on a surface of a substrate that is parallel with an XY plane.

The first quadrature oscillator 211 includes an I-phase oscillator 10 and a Q-phase oscillator 20. The I-phase oscillator 10 is an example first oscillator that outputs a first I-phase differential signal having phases that are different from each other by 180 degrees. The Q-phase oscillator 20 is an example second oscillator that outputs a first Q-phase differential signal having phases that are different from those of the first I-phase differential signal by 90 degrees or −90 degrees.

The I-phase oscillator 10 includes a first I-phase inductor $L_{I1}$ that is wound at least one turn, and outputs the first I-phase differential signal from a pair of nodes a1 and c1 that are located at both ends of the first I-phase inductor $L_{I1}$. For example, a 0-degrees clock that is one of the first I-phase differential signal is output from the node a1, and a 180-degree clock that is the other one of the first I-phase differential signal is output from the node c1. The Q-phase oscillator 20 includes a first Q-phase inductor $L_{Q1}$ that is wound at least one turn, and outputs the first Q-phase differential signal from a pair of nodes b1 and d1 that are located at both ends of the first Q-phase inductor $L_{Q1}$. For example, a 90-degree clock that is one of the first Q-phase differential signal is output from the node b1, and a 270-degree clock that is the other one of the first Q-phase differential signal is output from the node d1.

The 90-degree clock output from the node b1 lags 90 degrees behind the 0-degree clock output from the node a1. The 180-degree clock output from the node c1 lags 90 degrees behind the 90-degree clock output from the node b1. The 270-degree clock output from the node d1 lags 90 degrees behind the 180-degree clock output from the node c1.

The first quadrature oscillator 212 includes an I-phase oscillator 30 and a Q-phase oscillator 40. The I-phase oscillator 30 is an example third oscillator that outputs a second I-phase differential signal having phases that are different from each other by 180 degrees. The Q-phase oscillator 40 is an example fourth oscillator that outputs a second Q-phase differential signal having phases that are different from those of the second I-phase differential signal by 90 degrees or −90 degrees.

The I-phase oscillator 30 includes a second I-phase inductor $L_{I2}$ that is wound at least one turn, and outputs the second I-phase differential signal from a pair of nodes a2 and c2 that are located at both ends of the second I-phase inductor $L_{I2}$. For example, a 0-degree clock that is one of the second I-phase differential signal is output from the node a2, and a 180-degree clock that is the other one of the second I-phase differential signals is output from the node c2. The Q-phase oscillator 40 includes a second Q-phase inductor $L_{Q2}$ that is wound at least one turn, and outputs the second Q-phase differential signal from a pair of nodes d2 and b2 that are located at both ends of the second Q-phase inductor $L_{Q2}$. For example, a 270-degree clock that is one of the second Q-phase differential signal is output from the node d2, and a 90-degree clock that is the other one of the second Q-phase differential signals is output from the node b2.

The 90-degree clock output from the node b2 leads the 0-degree clock output from the node a2 by 90 degrees. The 180-degree clock output from the node c2 leads the 90-degree clock output from the node b2 by 90 degrees. The 270-degree clock output from the node d2 leads the 180-degree clock output from the node c2 by 90 degrees.

The quadrature oscillator 211 includes a first drive circuit 91. The first drive circuit 91 makes the phases of the first I-phase differential signal output from the first I-phase inductor $L_{I1}$ and the phases of the first Q-phase differential signal output from the first Q-phase inductor $L_{Q1}$ to be different from each other. The first drive circuit 91 generates a first I-phase current $I_{I1}$ that flows to the first I-phase inductor $L_{I1}$ and a first Q-phase current $I_{Q1}$ that flows to the first Q-phase inductor $L_{Q1}$ such that the phases of the first I-phase differential signal and the phases of the first Q-phase differential signal are different from each other. The first drive circuit 91 includes an I-phase circuit section 911 that controls the first I-phase current $I_{I1}$ and a Q-phase circuit section 91Q that controls the first Q-phase current $I_{Q1}$.

The quadrature oscillator 212 includes a second drive circuit 92. The second drive circuit 92 makes the phases of the second I-phase differential signal output from the second I-phase inductor $L_{I2}$ and the phases of the second Q-phase differential signal output from the second Q-phase inductor $L_{Q2}$ to be different from each other. The second drive circuit 92 generates a second I-phase current $I_{I2}$ that flows to the second I-phase inductor $L_{I2}$ and a second Q-phase current $I_{Q2}$ that flows to the second Q-phase inductor $L_{Q2}$ such that the phases of the second I-phase differential signal and the phases of the second Q-phase differential signal are different from each other. The second drive circuit 92 includes an I-phase circuit section 921 that controls the second I-phase current $I_{I2}$ and a Q-phase circuit section 92Q that controls the second Q-phase current $I_{Q2}$.

In this embodiment, as illustrated in FIG. 4, when the first I-phase current $I_{I1}$ and the second I-phase current $I_{I2}$ are in phase at a time t0, the second drive circuit 92 generates the second Q-phase current $I_{Q2}$ that has a phase inversed with respect to the first Q-phase current $I_{Q1}$ at a time t1. The time t1 represents a time after the time t0.

Here, a magnetic field that is generated by the passage of the first Q-phase current $I_{Q1}$ through the first Q-phase inductor $L_{Q1}$ is referred to as a "magnetic field $M_{Q1}$", and an induced current that passes through the second Q-phase inductor $L_{Q2}$ due to the magnetic field $M_{Q1}$ is referred to as an "induced current $I_{Q2M}$". Similarly, a magnetic field that is generated by the passage of the second Q-phase current $I_{Q2}$ through the second Q-phase inductor $L_{Q2}$ is referred to as a "magnetic field $M_{Q2}$", and an induced current that passes through the first Q-phase inductor $L_{Q1}$ due to the magnetic field $M_{Q2}$ is referred to as an "induced current $I_{Q1M}$".

The generation of the second Q-phase current $I_{Q2}$, which has the phase inversed with respect to the first Q-phase current $L_{Q1}$, causes the direction of the magnetic field $M_{Q1}$ in the second Q-phase inductor $L_{Q2}$ and the direction of the magnetic field $M_{Q2}$ in the first Q-phase inductor $L_{Q1}$ generated due to the second Q-phase current $I_{Q2}$ to be opposite to each other. With this configuration, the magnitude of the magnetic field $M_{Q1}$ in the second Q-phase inductor $L_{Q2}$ and the magnitude of the magnetic field $M_{Q2}$ in the first Q-phase inductor $L_{Q1}$ weaken each other, and thus the effects of the induced current $I_{Q2M}$ on the second Q-phase current $I_{Q2}$ and the effects of the induced current $I_{Q1M}$ on the first Q-phase current $I_{Q1}$ are reduced. Consequently, the crosstalk between the first Q-phase inductor $L_{Q1}$ and the second Q-phase inductor $L_{Q2}$ can be suppressed and thus the center distance between the first Q-phase inductor $L_{Q1}$ and the second Q-phase inductor $L_{Q2}$ can be further reduced. Accordingly, the size of the quadrature oscillation circuit 210 can be reduced.

Although not illustrated in FIG. 4, in this embodiment, when the first Q-phase current $I_{Q1}$ and the second Q-phase current $I_{Q2}$ are in phase at the time t0, the second drive circuit 92 generates the second I-phase current $I_{I2}$ that has a phase inversed with respect to the first I-phase current $I_{I1}$ at the time t1. The time t1 represents a time after the time t0.

Here, a magnetic field that is generated by the passage of the first I-phase current $I_{I1}$ through the first I-phase inductor $L_{I1}$ is referred to as a "magnetic field $M_{I1}$", and an induced current that passes through the second I-phase inductor $L_{I2}$ due to the magnetic field $M_{I1}$ is referred to as an "induced current $I_{I2M}$". Similarly, a magnetic field that is generated by the passage of the second I-phase current $I_{I2}$ through the second I-phase inductor $L_{I2}$ is referred to as a "magnetic field $M_{I2}$", and an induced current that passes through the first I-phase inductor $L_{I1}$ due to the magnetic field $M_{I2}$ is referred to as an "induced current $I_{I1M}$".

The generation of the second I-phase current $I_{I2}$, which has the phase inversed with respect to the first I-phase current $I_{I1}$, causes the direction of the magnetic field $M_{I1}$ in the second I-phase inductor $L_{I2}$ and the direction of the magnetic field $M_{I2}$ in the first I-phase inductor $L_{I1}$ generated due to the second I-phase current $I_{I2}$ to be opposite to each other. With this configuration, the magnitude of the magnetic field $M_{I1}$ in the second I-phase inductor $L_{I2}$ and the magnitude of the magnetic field $M_{I2}$ in the first I-phase inductor $L_{I1}$ weaken each other, and thus the effects of the induced current $I_{I2M}$ on the second I-phase current $I_{I2}$ and the effects of the induced current $I_{I1M}$ on the first I-phase current $I_{I1}$ are reduced. Consequently, the crosstalk between the first I-phase inductor $L_{I1}$ and the second I-phase inductor $L_{I2}$ can be suppressed and thus the center distance between the first I-phase inductor $L_{I1}$ and the second I-phase inductor $L_{I2}$ can be further reduced. Accordingly, the size of the quadrature oscillation circuit 210 can be reduced.

In order to suppress the crosstalk between the first Q-phase inductor $L_{Q1}$ and the second Q-phase inductor $L_{Q2}$, it is preferable that the first Q-phase inductor $L_{Q1}$ and the second Q-phase inductor $L_{Q2}$ be disposed to be symmetric with respect to a line. In this embodiment, the first Q-phase inductor $L_{Q1}$ and the second Q-phase inductor $L_{Q2}$ are disposed to be symmetric with respect to a symmetry axis that is parallel to the Y axis. The node b1, which is located at one end of the first Q-phase inductor $L_{Q1}$, and the node b2, which is located at one end of the second Q-phase inductor $L_{Q2}$, are disposed to be symmetric with respect to the symmetry axis that is parallel to the Y axis. The node d1, which is located at the other end of the first Q-phase inductor $L_{Q1}$, and the node d2, which is located at the other end of the second Q-phase inductor $L_{Q2}$, are disposed to be symmetric with respect to the symmetry axis that is parallel to the Y axis.

Similarly to the Q-phase side, in order to suppress the crosstalk between the first I-phase inductor $L_{I1}$ and the second I-phase inductor $L_{I2}$, it is preferable that the first I-phase inductor $L_{I1}$ and the second I-phase inductor $L_{I2}$ be disposed to be symmetric with respect to a line. For details, the above descriptions will be similarly applied.

In order to suppress the crosstalk between the first Q-phase inductor $L_{Q1}$ and the second Q-phase inductor $L_{Q2}$, it is preferable that the first Q-phase inductor $L_{Q1}$ and the second Q-phase inductor $L_{Q2}$ be disposed such that the axis directions are parallel to each other. In this embodiment, the first Q-phase inductor $L_{Q1}$ and the second Q-phase inductor $L_{Q2}$ are disposed such that the axis directions (inductor center lines) that pass through the respective inductor centers are parallel with the Z axis.

Similarly to the Q-phase side, in order to suppress the crosstalk between the first I-phase inductor $L_{I1}$ and the second I-phase inductor $L_{I2}$, it is preferable that the first I-phase inductor $L_{I1}$ and the second I-phase inductor $L_{I2}$ be disposed such that the axis directions are parallel with each other. For details, the above descriptions will be similarly applied.

Figure 5:
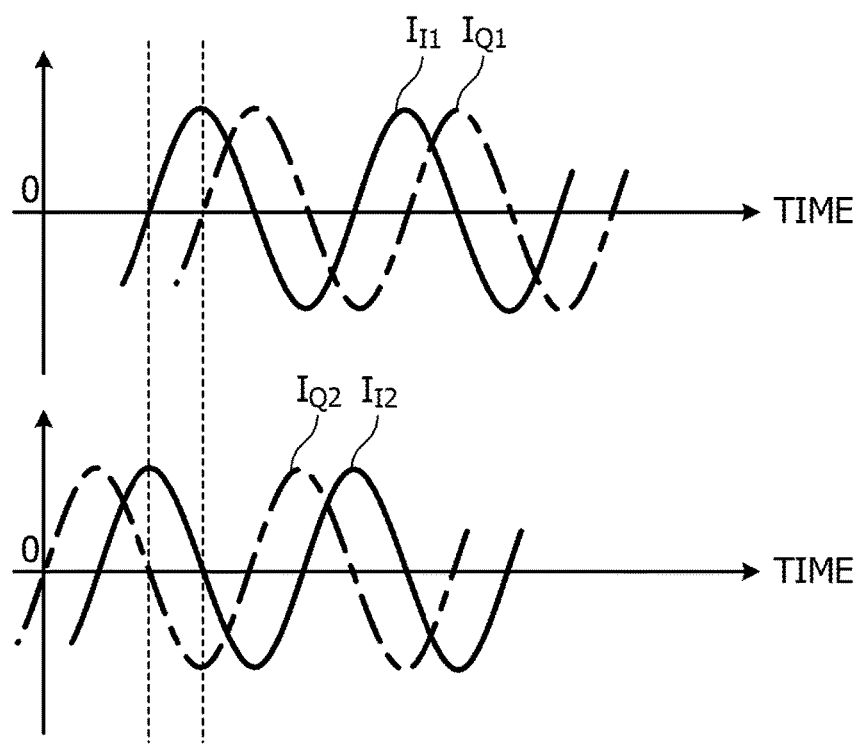
FIG. 5 is an exemplary waveform chart illustrating electric currents passing through respective inductors.

FIG. 5 is a waveform chart illustrating example inductor currents that pass through the inductors $L_{I1}$, $L_{Q1}$, $L_{I2}$, and $L_{Q2}$, respectively. The first drive circuit 91 changes the phases of the first I-phase current $I_{I1}$ and the first Q-phase current $I_{Q1}$ in accordance with a data signal input to the CDR section in the quadrature oscillator 211 while the phase of the first Q-phase current $I_{Q1}$ is lagging 90 degrees behind the phase of the first I-phase current $I_{I1}$. The second drive circuit 92 changes the phases of the second I-phase current $I_{I2}$ and the second Q-phase current $I_{Q2}$ in accordance with a data signal input to the CDR section in the quadrature oscillator 212 while the phase of the second Q-phase current $I_{Q2}$ is leading the phase of the second I-phase current $I_{I2}$ by 90 degrees.

In FIG. 5, the first drive circuit 91 delays the phase of the first Q-phase current $I_{Q1}$ with respect to the phase of the first I-phase current $I_{I1}$ by 90 degrees such that the phases of the first Q-phase differential signal are delayed with respect to the phases of the first I-phase differential signal. On the other hand, the second drive circuit 92 advances the phase of the second Q-phase current $I_{Q2}$ with respect to the phase of the second I-phase current $I_{I2}$ by 90 degrees such that the phases of the second Q-phase differential signal are advanced with respect to the phases of the second I-phase differential signal. As described above, when the first I-phase current $I_{I1}$ and the second I-phase current $I_{I2}$ are in phase by advancing the phase of one current while delaying the phase of the other current in adjacent inductors, the phase of the second Q-phase current $I_{Q2}$ can be inverted with respect to the phase of the first Q-phase current $I_{Q1}$. Similarly, when the first Q-phase current $I_{Q1}$ and the second Q-phase current $I_{Q2}$ are in phase by advancing the phase of one current while delaying the phase of the other current in the adjacent inductors, the phase of the second I-phase current $I_{I2}$ can be inverted with respect to the phase of the first I-phase current $I_{I1}$.

First Embodiment

Figure 6:
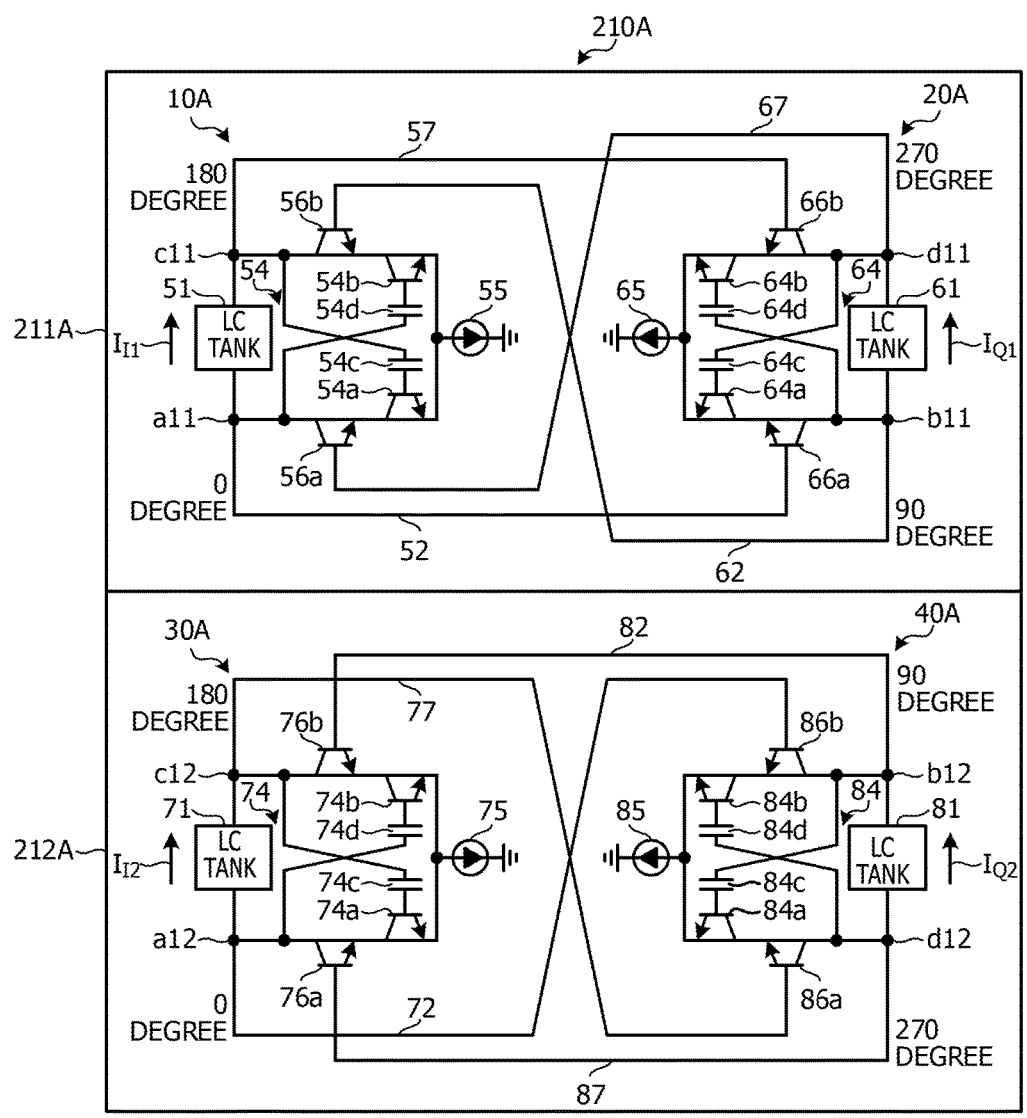
FIG. 6 illustrates a first example of a quadrature oscillation circuit according to a first embodiment.

FIG. 6 illustrates a first example of a quadrature oscillation circuit according to the first embodiment. A quadrature oscillation circuit 210A is an example quadrature oscillation circuit 210 in FIG. 4. The quadrature oscillation circuit 210A includes adjacent quadrature oscillators 211A and 212A.

The quadrature oscillator 211A includes an I-phase oscillator 10A that outputs a first I-phase differential signal that has phases different from each other by 180 degrees and a Q-phase oscillator 20A that outputs a first Q-phase differential signal that has phases different from the phases of the first I-phase differential signal by 90 degrees or −90 degrees.

The I-phase oscillator 10A includes an LC tank 51, a cross-coupled circuit 54, a tail current source 55, first input differential pair transistors 56a and 56b, and capacitors 54c and 54d.

The LC tank 51 is an example first resonator that has an inductor and a capacitor connected in parallel. The cross-coupled circuit 54 is an example first cross-coupled circuit. The cross-coupled circuit 54 has a pair of cross-coupled transistors 54a and 54b that are connected to the LC tank 51. The pair of the transistors 54a and 54b are an example first pair of transistors. The tail current source 55 is an example first tail current source, and connected to the pair of the transistors 54a and 54b. To the first input differential pair transistors 56a and 56b, the first Q-phase differential signal is input.

The Q-phase oscillator 20A includes an LC tank 61, a cross-coupled circuit 64, a tail current source 65, second input differential pair transistors 66a and 66b, and capacitors 64c and 64d.

The LC tank 61 is an example second resonator that has an inductor and a capacitor connected in parallel. The cross-coupled circuit 64 is an example second cross-coupled circuit. The cross-coupled circuit 64 has a pair of the cross-coupled transistors 64a and 64b that are connected to the LC tank 61. The pair of the transistors 64a and 64b are an example second pair of transistors. The tail current source 65 is an example second tail current source, and connected to the pair of the transistors 64a and 64b. To the second input differential pair transistors 66a and 66b, the first I-phase differential signal is input.

The first input differential pair transistors 56a and 56b are connected in series to the first pair of the transistors 54a and 54b. The second input differential pair transistors 66a and 66b are connected in series to the second pair of the transistors 64a and 64b.

The I-phase oscillator 10A includes a pair of output terminals a11 and c11 that outputs the first I-phase differential signal. The Q-phase oscillator 20A includes a pair of output terminals b11 and d11 that outputs first Q-phase differential signal. The LC tank 51 is connected between the first output terminal a11 and the second output terminal c11. The LC tank 61 is connected between the third output terminal b11 and the fourth output terminal d11. The output terminals a11, c11, b11, and d11 are example nodes a1, c1, b1, and d1, respectively illustrated in FIG. 4.

The first transistor 54a, which is connected to the first output terminal a11 via the transistor 56a, and the second transistor 54b, which is connected to the second output terminal c11 via the transistor 56b, are transistors for oscillation. In the first transistor 54a, the base is connected to the second output terminal c11 via the capacitor 54c, the collector is connected to the first output terminal a11 via the transistor 56a, and the emitter is connected to the tail current source 55. In the second transistor 54b, the base is connected to the first output terminal a11 via the capacitor 54d, the collector is connected to the second output terminal c11 via the transistor 56b, and the emitter is connected to the tail current source 55.

The tail current source 55 supplies a tail current of a first value to the pair of the transistors 54a and 54b in the cross-coupled circuit 54. The first tail current value represents a current value of the oscillation tail current. The tail current source 55 is connected between a common junction point of the pair of the transistors 54a and 54b and a ground.

An input differential pair is configured with the third transistor 56a, which is connected to the first transistor 54a in series and connected to the fourth output terminal d11, and the fourth transistor 56b, which is connected to the second transistor 54b in series and connected to the third output terminal dn. The input differential pair represents transistors for injection. In the third transistor 56a, the base is connected to the fourth output terminal d11 via a line 67, the collector is connected to the first output terminal a11, and the emitter is connected to the collector of the transistor 54a. In the fourth transistor 56b, the base is connected to the third output terminal b11 via a line 62, the collector is connected to the second output terminal c11, and the emitter is connected to the collector of the transistor 54b.

The first transistor 64a, which is connected to the third output terminal b11 via the transistor 66a, and the sixth transistor 64b, which is connected to the fourth output terminal d11 via the transistor 66b, are transistors for oscillation. In the fifth transistor 64a, the base is connected to the fourth output terminal d11 via the capacitor 64c, the collector is connected to the third output terminal b11 via the transistor 66a, and the emitter is connected to the tail current source 65. In the sixth transistor 64b, the base is connected to the third output terminal b11 via the capacitor 64d, the collector is connected to the fourth output terminal d11 via the transistor 66b, and the emitter is connected to the tail current source 65.

The tail current source 65 supplies a tail current of a second value to the pair of the transistors 64a and 64b in the cross-coupled circuit 64. The second tail current value represents a current value of the oscillation tail current. The tail current source 65 is connected between a common junction point of the pair of the transistors 64a and 64b and a ground.

An input differential pair is configured with the seventh transistor 66a, which is connected to the fifth transistor 64a in series and connected to the first output terminal a11, and the eighth transistor 66b, which is connected to the sixth transistor 64b in series and connected to the second output terminal c11. The input differential pair represents transistors for injection. In the seventh transistor 66a, the base is connected to the first output terminal a11 via a line 52, the collector is connected to the third output terminal b11, and the emitter is connected to the collector of the transistor 64a. In the eighth transistor 66b, the base is connected to the second output terminal c11 via a line 57, the collector is connected to the fourth output terminal d11, and the emitter is connected to the collector of the transistor 64b.

Each of the transistors 54a, 54b, 56a, 56b, 64a, 64b, 66a, and 66b is, for example, an npn bipolar transistor. Each of the transistors may be an N-channel metal oxide semiconductor field-effect transistor (MOSFET). In such a case, the base corresponds to the gate, the collector corresponds to the drain, and the emitter corresponds to the source.

The quadrature oscillator 212A includes an I-phase oscillator 30A that outputs a second I-phase differential signal that has phases different from each other by 180 degrees and a Q-phase oscillator 40A that outputs a second Q-phase differential signal that has phases different from the phases of the second I-phase differential signal by 90 degrees or −90 degrees. The I-phase oscillator 30A includes an LC tank 71, a cross-coupled circuit 74, a tail current source 75, first input differential pair transistors 76a and 76b, and capacitors 74c and 74d. The cross-coupled circuit 74 has a pair of cross-coupled transistors 74a and 74b that are connected to the LC tank 71. The Q-phase oscillator 40A includes an LC tank 81, a cross-coupled circuit 84, a tail current source 85, second input differential pair transistors 86a and 86b, and capacitors 84c and 84d. The cross-coupled circuit 84 has a pair of cross-coupled transistors 84a and 84b that are connected to the LC tank 81.

The quadrature oscillator 211A and the quadrature oscillator 212A are different in that their bases of the transistors for injection are connected to different terminals. The base of the transistor 76a is connected to the output terminal d12 via a line 87, and the base of the transistor 76b is connected to the output terminal b12 via the line 82. The base of the transistor 86a is connected to the output terminal c12 via a line 77, and the base of the transistor 86b is connected to the output terminal a12 via the line 72. The output terminals a12, c12, b12, and d12 are example nodes a2, c2, b2, and d2, respectively illustrated in FIG. 4. The other configurations are similar to those in the quadrature oscillator 211A, and accordingly, the above descriptions are similarly applied.

Figure 7:
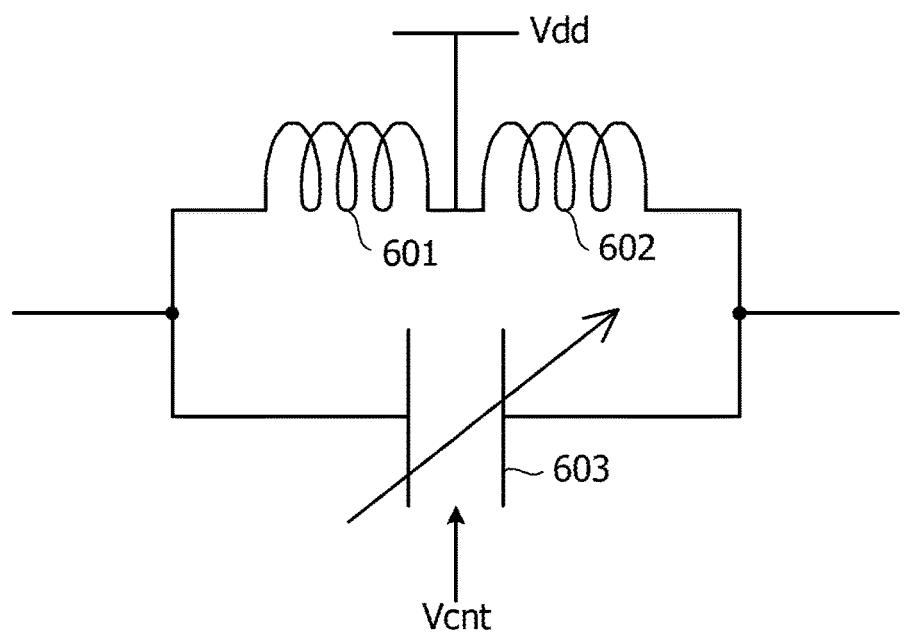
FIG. 7 illustrates an exemplary configuration of an LC tank.

FIG. 7 illustrates an exemplary configuration of an LC tank. The LC tank illustrated in FIG. 7 is an example of the LC tanks 51, 61, 71, and 81 illustrated in FIG. 6. The LC tank has an inductor and a capacitor connected in parallel. The inductor includes an inductor section 601 and an inductor section 602, and is connected to a power line of a power source voltage Vdd between the inductor section 601 and the inductor section 602. One output terminal is connected to the power line of the power source voltage Vdd via the inductor section 601 and the other output terminal is connected to the power line of the power source voltage Vdd via the inductor section 602. A capacitor 603 is, for example, a variable capacitor that can vary capacitance in accordance with a control voltage Vcnt. The capacitor 603 may be a varactor or a variable capacitance diode.

The quadrature oscillation circuit 210A in FIG. 6 can be operated in two oscillation modes (rotation modes). The quadrature oscillator 211A oscillates in a first oscillation mode and the quadrature oscillator 212A oscillates in a second oscillation mode.

The operation of the quadrature oscillator 211A in FIG. 6 will be described by describing a flow of a clock voltage signal from/to the output terminal a11. A 0-degree clock output from the output terminal a11 is injected into the Q-phase transistor 66a and a 90-degree clock whose phase is delayed with respect to the 0-degree clock by 90 degrees is output from the output terminal b11. The 90-degree clock output from the output terminal b11 is injected into the I-phase transistor 56b and a 180-degree clock whose phase is delayed with respect to the 90-degree clock by 90 degrees is output from the output terminal c11. The 180-degree clock output from the output terminal c11 is injected into the Q-phase transistor 66b and a 270-degree clock whose phase is delayed with respect to the 180-degree clock by 90 degrees is output from the output terminal d11. The 270-degree clock output from the output terminal d11 is injected into the I-phase transistor 56a and a 0-degree clock whose phase is delayed with respect to the 270-degree clock by 90 degrees is output from the output terminal c11.

The operation of the quadrature oscillator 212A in FIG. 6 will be described by describing a flow of a clock voltage signal from/to the output terminal a12. A 0-degree clock output from the output terminal a12 is injected into the Q-phase transistor 86b and a 90-degree clock whose phase is advanced with respect to the 0-degree clock by 90 degrees is output from the output terminal b12. The 90-degree clock output from the output terminal b12 is injected into the I-phase transistor 76b and a 180-degree clock whose phase is advanced with respect to the 90-degree clock by 90 degrees is output from the output terminal c12. The 180-degree clock output from the output terminal c12 is injected into the Q-phase transistor 86a and a 270-degree clock whose phase is advanced with respect to the 180-degree clock by 90 degrees is output from the output terminal d12. The 270-degree clock output from the output terminal d12 is injected into the I-phase transistor 56a and a 0-degree clock whose phase is advanced with respect to the 270-degree clock by 90 degrees is output from the output terminal a12.

With the configuration in FIG. 6, when the phase of the first I-phase current $I_{I1}$ and the phase of the second I-phase current $I_{I2}$ are in phase, the phase of the second Q-phase current $I_{Q2}$ can be inverted with respect to the phase of the first Q-phase current $I_{Q1}$. Furthermore, when the phase of the first Q-phase current $I_{Q1}$ and the phase of the second Q-phase current $I_{Q2}$ are in phase, the phase of the second I-phase current $I_{I2}$ can be inverted with respect to the phase of the first I-phase current $I_{I1}$. Furthermore, with the configuration in FIG. 6, the phase of the first Q-phase current $I_{Q1}$ can be delayed with respect to the phase of the first I-phase current $I_{I1}$ by 90 degrees such that the phases of the first Q-phase differential signal are delayed with respect to the phases of the first I-phase differential signal. Furthermore, the phase of the second Q-phase current $I_{Q2}$ can be advanced with respect to the phase of the second I-phase current $I_{I2}$ by 90 degrees such that the phases of the second Q-phase differential signal are advanced with respect to the phases of the second I-phase differential signal.

Figure 8:
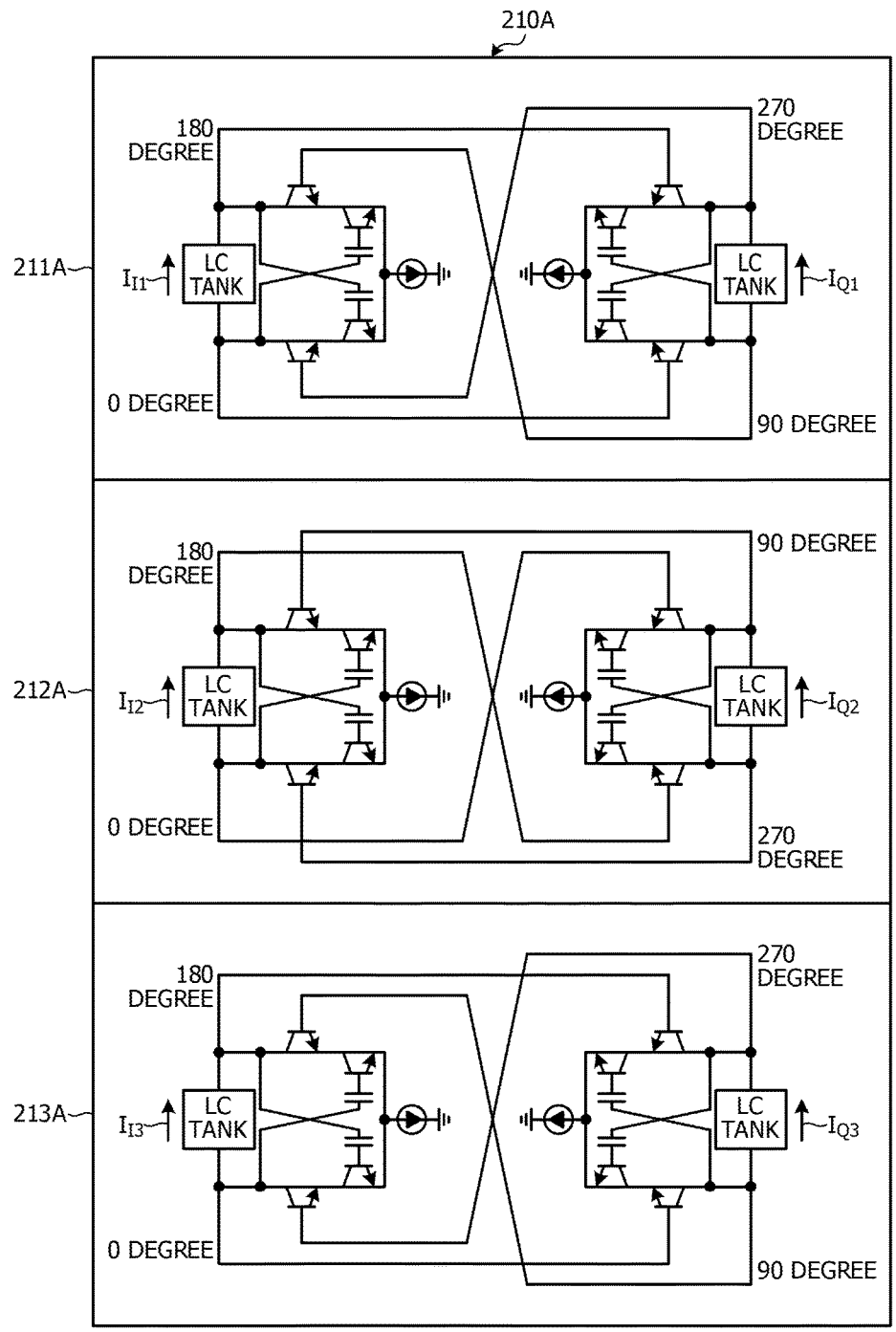
FIG. 8 illustrates a second example of a quadrature oscillation circuit according to the first embodiment.
Figure 9:
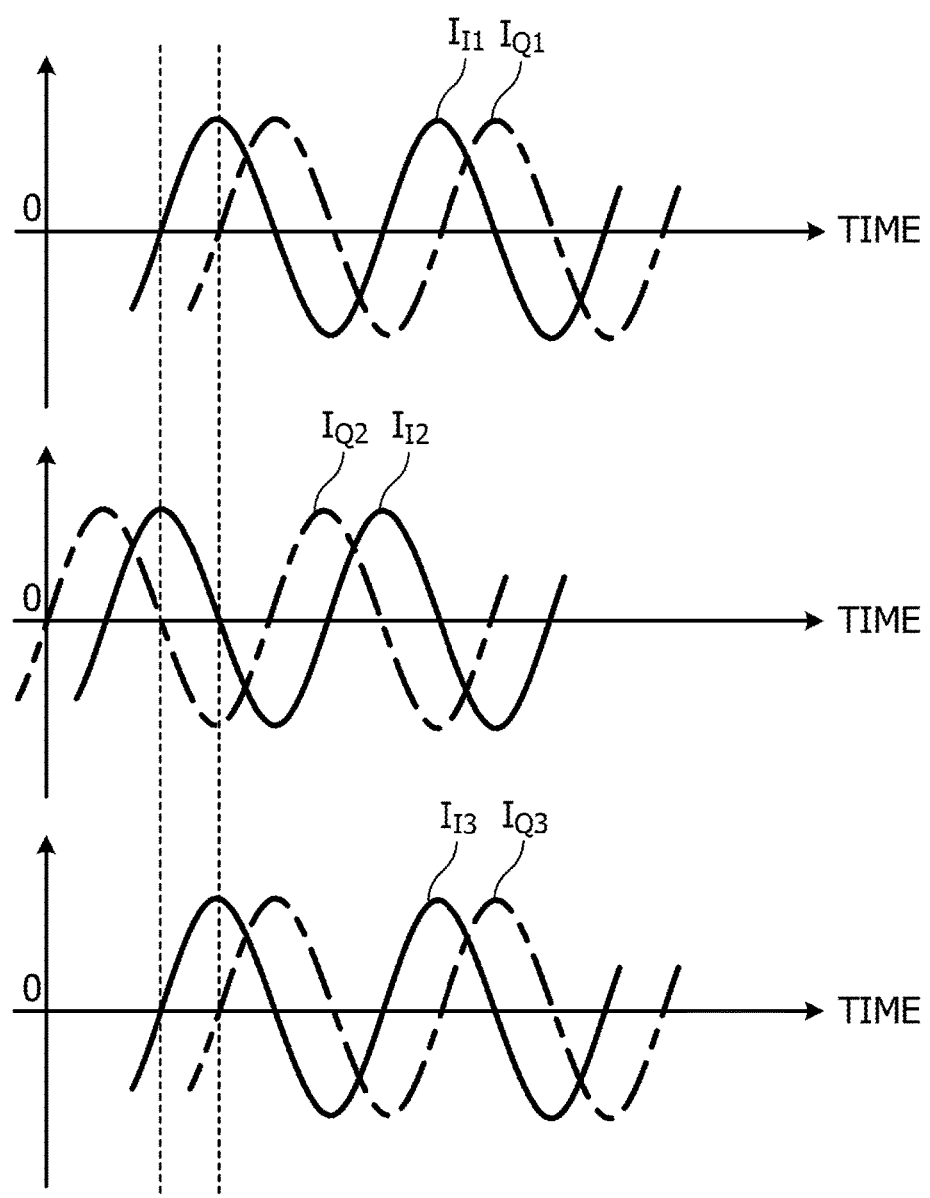
FIG. 9 is an exemplary waveform chart illustrating electric currents passing through respective inductors.

FIG. 8 illustrates a second example of a quadrature oscillation circuit according to the first embodiment. FIG. 9 is a waveform chart illustrating example inductor currents that pass through the inductors in LC tanks respectively.

In FIG. 8, three adjacent quadrature oscillators 211A, 212A, and 213A are provided. The quadrature oscillators 211A and 213A have the same configuration. Consequently, similarly to the configuration in FIG. 6, in the configuration in FIG. 8, when the phase of the first I-phase current $I_{I1}$ and the phase of the second I-phase current $I_{I2}$ are in phase, the phase of the second Q-phase current $I_{Q2}$ can be inverted with respect to the phase of the first Q-phase current $I_{Q1}$. Furthermore, when the phase of the second I-phase current $I_{I2}$ and the phase of the third I-phase current $I_{I3}$ are in phase, the phase of the third Q-phase current $I_{Q3}$ can be inverted with respect to the phase of the second Q-phase current $I_{Q2}$. Furthermore, when the phase of the first Q-phase current $I_{Q1}$ and the phase of the second Q-phase current $I_{Q2}$ are in phase, the phase of the second I-phase current $I_{I2}$ can be inverted with respect to the phase of the first I-phase current $I_{I1}$. Furthermore, when the phase of the second Q-phase current $I_{Q2}$ and the phase of the third Q-phase current $I_{Q3}$ are in phase, the phase of the third I-phase current $I_{I3}$ can be inverted with respect to the phase of the second I-phase current $I_{I2}$.

Figure 10:
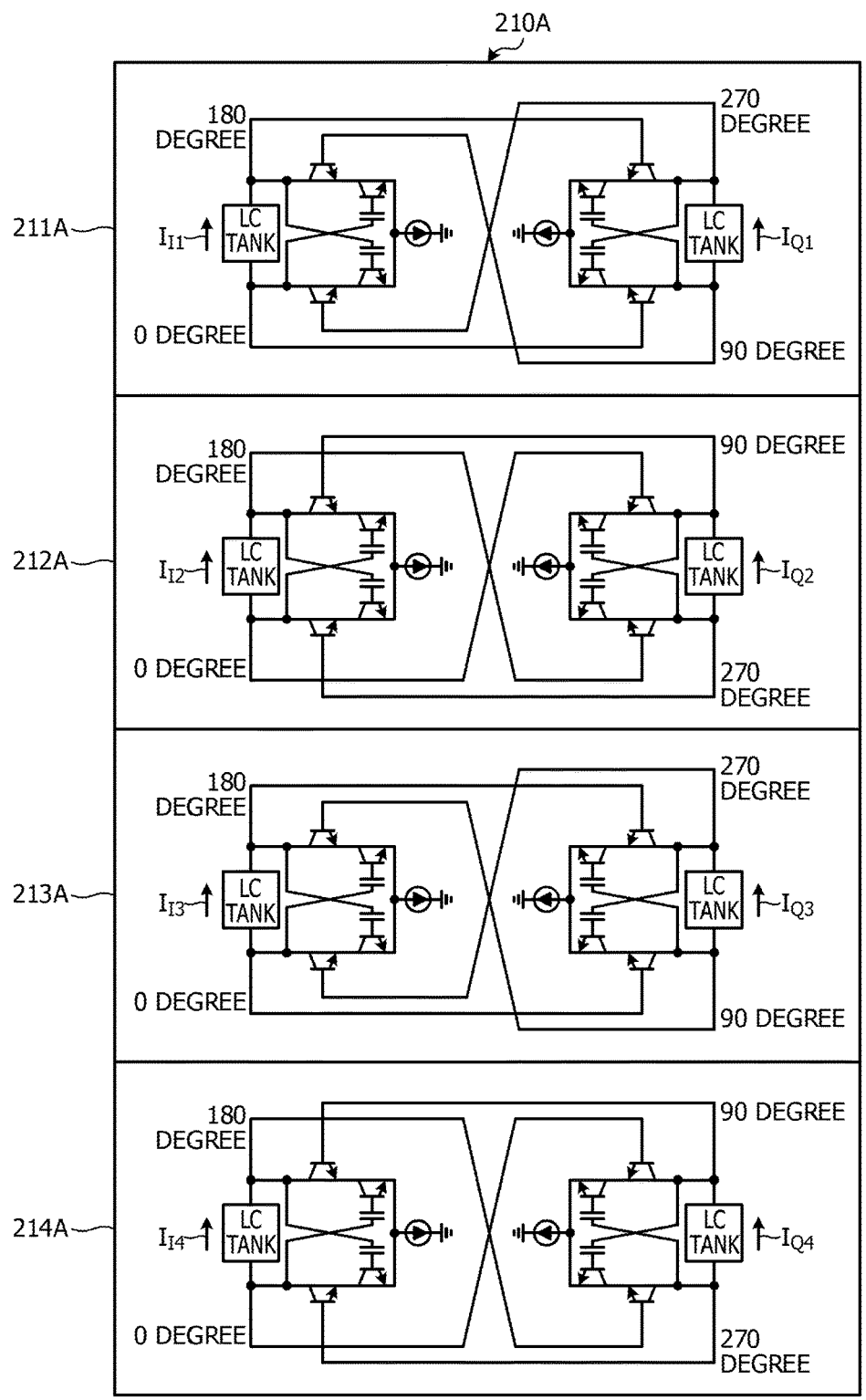
FIG. 10 illustrates a third example of a quadrature oscillation circuit according to the first embodiment.
Figure 11:
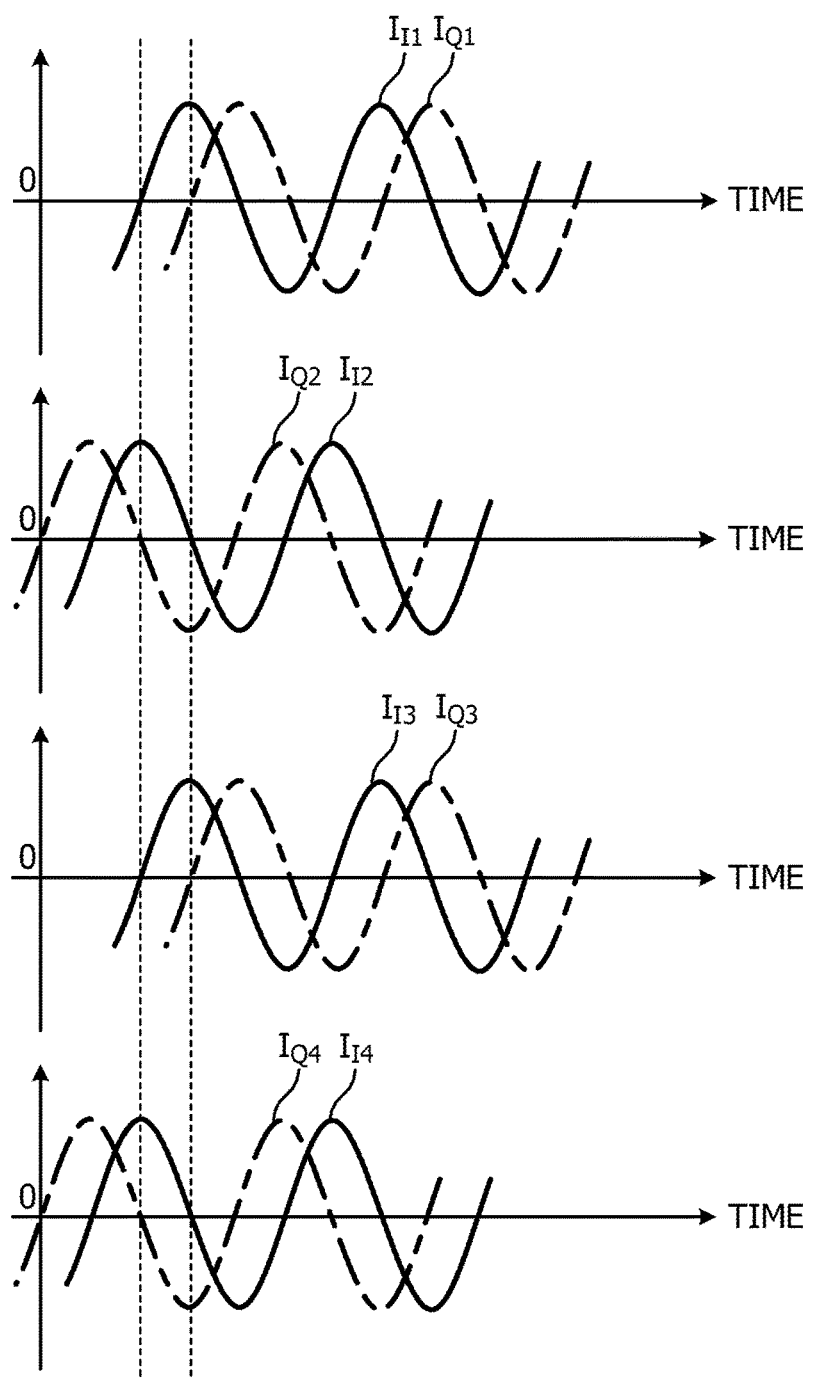
FIG. 11 is an exemplary waveform chart illustrating electric currents passing through respective inductors.

FIG. 10 illustrates a third example of a quadrature oscillation circuit according to the first embodiment. FIG. 11 is a waveform chart illustrating example inductor currents that pass through the inductors in the LC tanks in FIG. 10 respectively.

In FIG. 10, four adjacent quadrature oscillators 211A, 212A, 213A, 214A are provided. The quadrature oscillators 211A and 213A have the same configuration, and the quadrature oscillators 212A and 214A have the same configuration. With the configuration in FIG. 10, when the phase of the third I-phase current $I_{I3}$ and the phase of the fourth I-phase current $I_{I4}$ are in phase, the phase of the fourth Q-phase current $I_{Q4}$ can be inverted with respect to the phase of the third Q-phase current $I_{Q3}$. Furthermore, when the phase of the third Q-phase current $I_{Q3}$ and the phase of the fourth Q-phase current $I_{Q4}$ are in phase, the phase of the fourth I-phase current $I_{I4}$ can be inverted with respect to the phase of the third I-phase current $I_{I3}$.

As described above, according to the first embodiment, in adjacent quadrature oscillators, when the electric currents passing through inductors of one of an I-phase and a Q-phase are in phase, the phases of electric currents passing through the inductors of the other phase are changed such that the phases of the electric currents becomes opposite to each other to reduce the interference between the inductors in phase.

Second Embodiment

Figure 12:
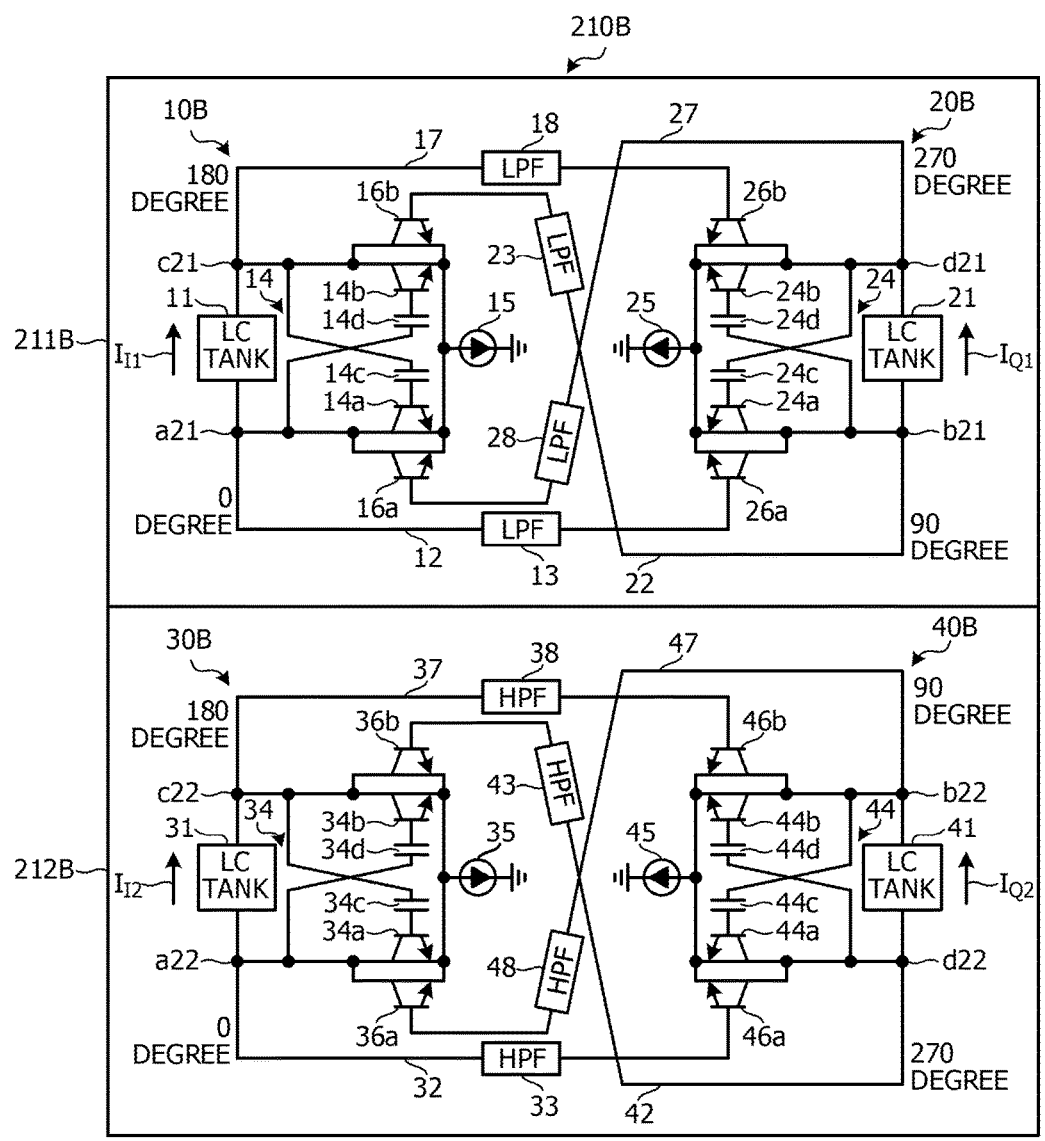
FIG. 12 illustrates a first example of a quadrature oscillation circuit according to a second embodiment.

FIG. 12 illustrates a first example of a quadrature oscillation circuit according to a second embodiment. A quadrature oscillation circuit 210B is an example quadrature oscillation circuit 210 in FIG. 4. The quadrature oscillation circuit 210B includes two adjacent quadrature oscillators 211B and 212B.

The quadrature oscillator 211B includes an I-phase oscillator 1013 that outputs a first I-phase differential signal that has phases different from each other by 180 degrees and a Q-phase oscillator 20B that outputs a first Q-phase differential signal that has phases different from the phases of the first I-phase differential signals by 90 degrees or −90 degrees. The I-phase oscillator 1013 includes an LC tank 11, a cross-coupled circuit 14, a tail current source 15, first input differential pair transistors 16a and 16b, and capacitors 14c and 14d. The cross-coupled circuit 14 has a pair of cross-coupled transistors 14a and 14b that are connected to the LC tank 11. The Q-phase oscillator 20B includes an LC tank 21, a cross-coupled circuit 24, a tail current source 25, second input differential pair transistors 26a and 26b, and capacitors 24c and 24d. The cross-coupled circuit 24 has a pair of cross-coupled transistors 24a and 24b that are connected to the LC tank 21.

The quadrature oscillator 211B in FIG. 12 is different from the quadrature oscillator 211A in FIG. 6 in that connection points of transistors for injection are different and low-pass filters (LPFs) 13, 18, 23, and 28 are further included. The base of the transistor 16a is connected to an output terminal d21 via the LPF 28 that is inserted into a line 27, and the base of the transistor 16b is connected to an output terminal b21 via the LPF 23 that is inserted into a line 22. The base of the transistor 26a is connected to an output terminal a21 via the LPF 13 that is inserted into a line 12, and the base of the transistor 26b is connected to an output terminal c21 via the LPF 18 that is inserted into a line 17. The LPFs can delay phases. The transistors 16a, 16b, 26a, and 26b are connected to the transistors 14a, 14b, 24a, and 24b in parallel, respectively. The output terminals a21, c21, b21, and d21 are example nodes a1, c1, b1, and d1 illustrated in FIG. 4, respectively. The other configurations are similar to those in the quadrature oscillator 211A, and accordingly, the above descriptions are similarly applied.

The quadrature oscillator 212B in FIG. 12 is different from the quadrature oscillator 211A in FIG. 6 in that connection points of transistors for injection are different and high-pass filters (HPFs) 33, 38, 43, and 48 are further included. The base of the transistor 36a is connected to an output terminal b22 via the HPF 48 that is inserted into a line 47, and the base of the transistor 36b is connected to an output terminal d22 via the HPF 43 that is inserted into a line 42. The base of the transistor 46a is connected to an output terminal a22 via the HPF 33 that is inserted into a line 32, and the base of the transistor 46b is connected to an output terminal c22 via the HPF 38 that is inserted into a line 37. The LPFs can advance phases. The transistors 36a, 36b, 46a, and 46b are connected to the transistors 34a, 34b, 44a, and 44b in parallel, respectively. The output terminals a22, c22, b22, and d22 are example nodes a2, c2, b2, and d2, respectively illustrated in FIG. 4. The other configurations are similar to those in the quadrature oscillator 211A, and accordingly, the above descriptions are similarly applied.

With the configuration in FIG. 12, when the phase of the first I-phase current $I_{I1}$ and the phase of the second I-phase current $I_{I2}$ are in phase, the phase of the second Q-phase current $I_{Q2}$ can be inverted with respect to the phase of the first Q-phase current $I_{Q1}$. Furthermore, when the phase of the first Q-phase current $I_{Q1}$ and the phase of the second Q-phase current $I_{Q2}$ are in phase, the phase of the second I-phase current $I_{I2}$ can be inverted with respect to the phase of the first I-phase current $I_{I1}$.

As described above, according to the second embodiment, in adjacent quadrature oscillators, when the electric currents passing through inductors of one of an I-phase and a Q-phase are in phase, the phases of electric currents passing through the inductors of the other phase are changed such that the phases of the electric currents becomes opposite to each other to reduce the interference between the inductors in phase.

CDR Circuit

Figure 13:
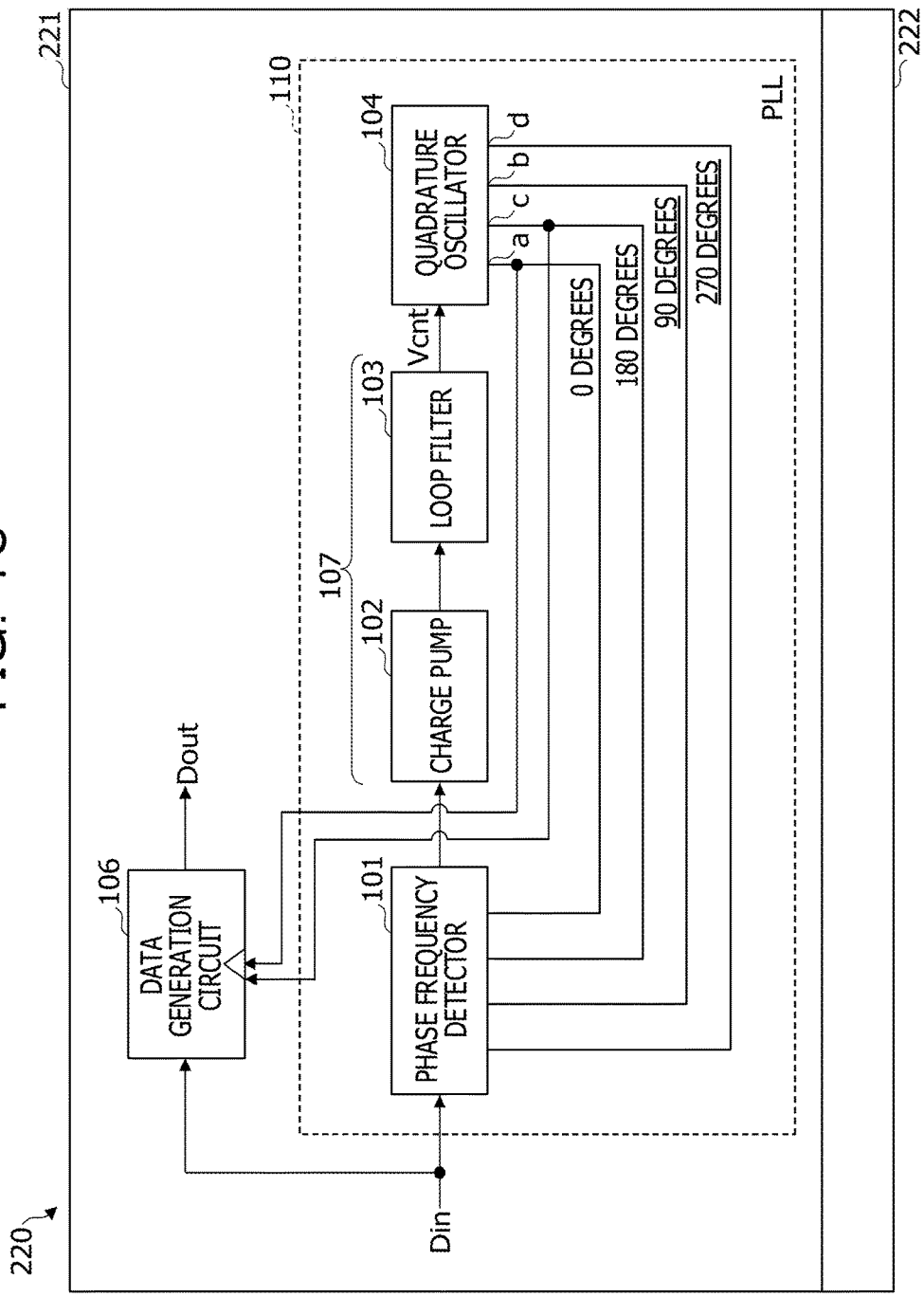
FIG. 13 illustrates an exemplary configuration of a CDR circuit.

FIG. 13 illustrates an exemplary configuration of a CDR circuit according to an embodiment. A CDR circuit 220 includes adjacent CDR sections. FIG. 13 illustrates two adjacent CDR sections 221 and 222.

The CDR section 221 recovers a clock and data Dout from a received data signal on which the clock is superimposed. The CDR section 221 includes a phase-locked loop (PLL) 110 and data generation circuit 106. The PLL circuit 110 includes a quadrature oscillator 104, a phase frequency detector 101, and a control voltage generation circuit 107. For the quadrature oscillator 104, a quadrature oscillator according to an embodiment may be employed. The control voltage generation circuit 107 includes a charge pump 102 and a loop filter 103.

The CDR section 222 has a configuration similar to that of the CDR section 221. The CDR section 221 and the CDR section 222, however, have different configurations in the quadrature oscillators 104. The quadrature oscillator 104 in the CDR section 221 has, for example, the same configuration as the quadrature oscillator 211 in FIG. 4, that is, has the I-phase oscillator 10 and the Q-phase oscillator 20. The quadrature oscillator 104 in the CDR section 222 has, for example, the same configuration as the quadrature oscillator 212 in FIG. 4, that is, has the I-phase oscillator 30 and the Q-phase oscillator 40.

The I-phase oscillators 10 and 30 output an I-phase differential signal (a 0-degree clock and a 180-degree clock) from a pair of output terminals a and c. The Q-phase oscillators 20 and 40 output a Q-phase differential signal (a 90-degree clock and a 270-degree clock) from a pair of output terminals b and d.

The phase frequency detector 101 uses an I-phase differential signal and a Q-phase differential signal to compare the phases of a received data signal Din with the phases of the I-phase differential signal. The phase frequency detector 101 uses an I-phase differential signal and a Q-phase differential signal to compare the frequency of a received data signal Din with the frequency of the I-phase differential signal.

The phase frequency detector 101 generates a phase detection signal PDI that indicates a result of a comparison of the phases of a received data signal Din and the phases of an I-phase differential signal, and a frequency detection signal FDO that indicates a result of a comparison of the frequency of a received data signal Din and the frequency of an I-phase differential signal. The phase frequency detector 101 outputs the generated phase detection signal PDI and frequency detection signal FDO to the charge pump 102.

Figure 14:
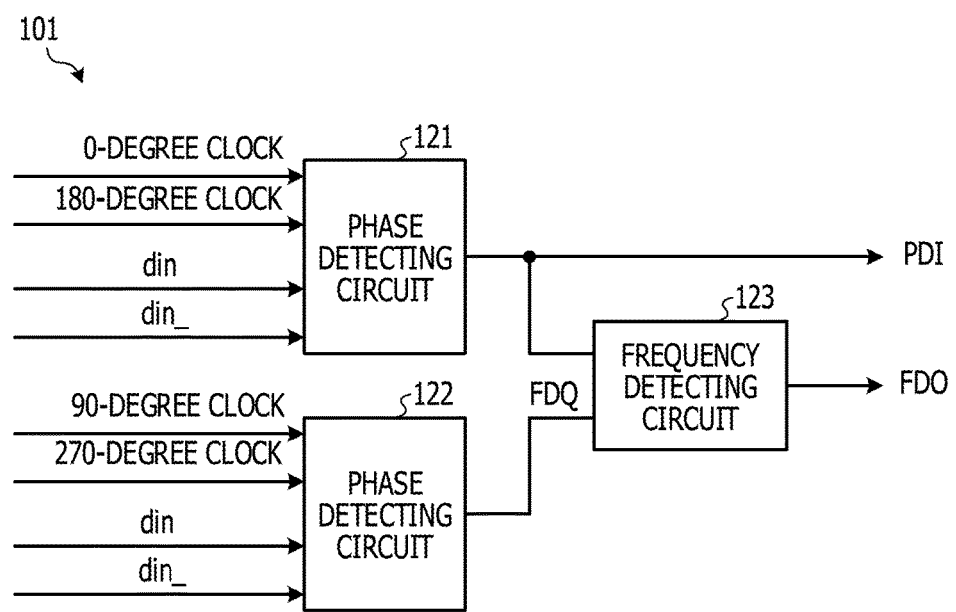
FIG. 14 illustrates an exemplary configuration of a phase frequency detector.

FIG. 14 illustrates an exemplary configuration of the phase frequency detector. The phase frequency detector 101 includes a first phase detecting circuit 121, a second phase detecting circuit 122, and a third frequency detecting circuit 123. The first phase detecting circuit 121, the second phase detecting circuit 122, and the third frequency detecting circuit 123 have known configurations. For example, two sample and hold circuits (latch circuits) and a multiplexer may constitute a first differential-type phase detecting circuit and a second differential-type phase detecting circuit. Alternatively, for example, two latch circuits and a modified multiplexer may constitute a differential-type frequency detecting circuit.

The received data signal Din to be input to the phase frequency detector 101 includes differential data signals din and din_ that have opposite phases. The phase detecting circuit 121 outputs a first phase detection signal PDI corresponding to a phase difference between the received data signal Din and the I-phase differential signal. Specifically, the phase detecting circuit 121 generates a first phase detection signal PDI that indicates whether change edges of the I-phase differential signal (a 0-degree clock and a 180-degree clock) lead or lag with respect to change edges of the differential data signals din and din_. The phase detecting circuit 122 outputs a second phase detection signal PDQ corresponding to a phase difference between the received data signal Din and the Q-phase differential signal. Specifically, the phase detecting circuit 122 generates a second phase detection signal PDQ that indicates whether change edges of the Q-phase differential signal (a 90-degree clock and a 270-degree clock) lead or lag with respect to change edges of the differential data signals din and din_.

The frequency detecting circuit 123 generates a frequency detection signal FDO from the direction of the change edge of the phase detection signal PDI and the value of the phase detection signal PDQ that has been latched at the change edge of the phase detection signal PDI. The frequency detection signal FDO indicates whether the frequency of the I-phase differential signal is lower or higher than the frequency of the received data signal Din. The frequency detection signal FDO indicates +1 when the frequency of the I-phase differential signal is lower than the frequency of the received data signal Din, indicates −1 when higher, and indicates 0 when the same. The phase detection signal PDI and the frequency detection signal FDO are supplied to the charge pump 102 (see FIG. 13).

The charge pump 102 uses the phase detection signal PDI and the frequency detection signal FDO supplied from the phase frequency detector 101 to generate a signal for compensating the phase difference and the frequency difference between the received data signal Din and the I-phase differential signal. The charge pump 102 outputs an up signal Up to the loop filter 103 when determining that the phases of the I-phase differential signal are lagging behind the phases of the received data signal Din or when determining that the frequency of the I-phase differential signal is lower than the frequency of the received data signal Din. The charge pump 102 outputs a down signal Down to the loop filter 103 when determining that the phases of the I-phase differential signal are leading the phases of the received data signal Din or when determining that the frequency of the I-phase differential signal is higher than the frequency of the received data signal Din.

The loop filter 103 supplies a control voltage Vcnt for adjusting the frequencies and the phases of the I-phase differential signal and the Q-phase differential signal to the LC tanks in the quadrature oscillator 104. The control voltage Vcnt allows fine adjustment of the frequencies and the phases of the I-phase differential signal and the Q-phase differential signal.

The loop filter 103 varies the control voltage Vcnt to be supplied to the quadrature oscillator 104 in accordance with an up signal UP or a down signal Down supplied from the charge pump 102. The loop filter 103 increases the control voltage Vcnt to be supplied to the quadrature oscillator 104 in accordance with an up signal UP from the charge pump 102. The increased control voltage Vcnt causes the phases of the I-phase differential signal to advance and the frequency of the I-phase signal to increase. The loop filter 103 decreases the control voltage Vcnt to be supplied to the quadrature oscillator 104 in accordance with a down signal Down from the charge pump 102. The decreased control voltage Vcnt causes the phases of the I-phase differential signal to delay and the frequency of the I-phase signal to decrease.

The quadrature oscillator 104 generates an I-phase differential signal that has a frequency and phases that have been finely adjusted in accordance with the control voltage Vcnt supplied from the loop filter 103 and a Q-phase differential signal that has phases inverted with respect to the I-phase differential signal.

The data generation circuit 106 is, for example, a data flip-flop. The data generation circuit 106 samples a received data signal Din in accordance with an I-phase differential signal output from the quadrature oscillator 104 to recover data Dout from the received data signal Din.

Advantages of Embodiments

Figure 15:
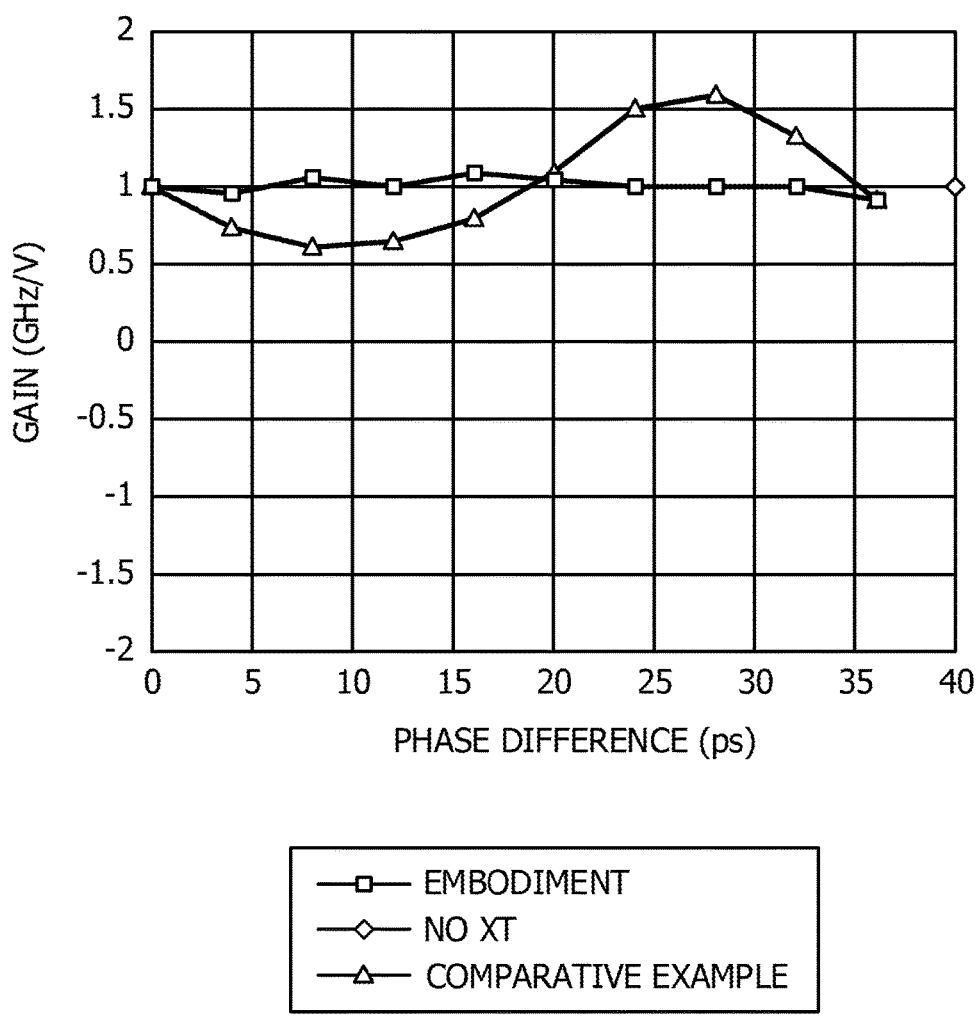
FIG. 15 illustrates exemplary gain characteristics when an inductor center distance is 250 µm.
Figure 16:
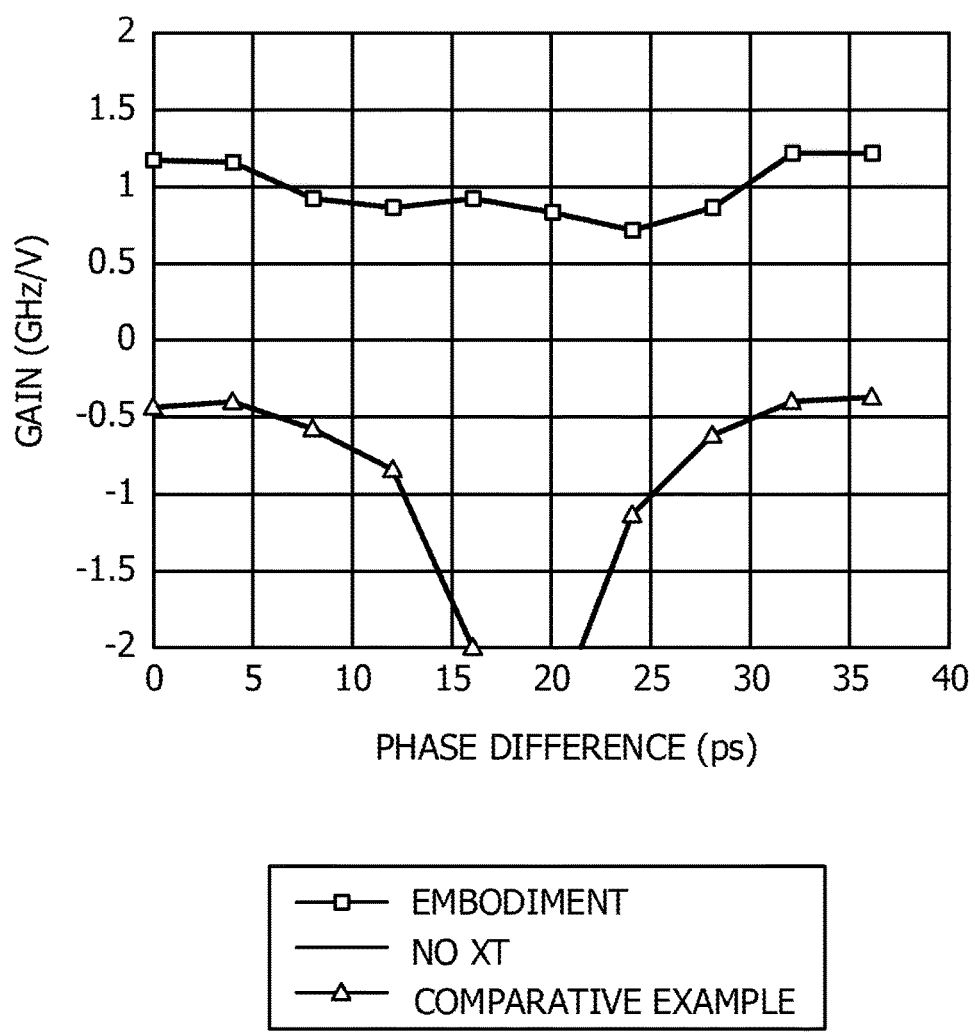
FIG. 16 illustrates exemplary gain characteristics when an inductor center distance is 100 µm.

FIG. 15 illustrates example gain characteristics when an inductor center distance is 250 μm. FIG. 16 illustrates example gain characteristics when an inductor center distance is 100 μm. FIGS. 15 and 16 illustrate example simulation results obtained by varying phase differences of input signals input to preamplifiers (see FIG. 1) in adjacent sending sections in two adjacent quadrature oscillators. The horizontal axis represents phase differences of input signals. The vertical axis represents the rate of change (gain) of the four-phase clocks output from the quadrature oscillators with respect to the control voltage Vcnt. The comparative examples illustrate results in adjacent quadrature oscillators of the same configuration, whereas the embodiment illustrates results in adjacent quadrature oscillators according to the embodiment that have different configurations.

In FIG. 15, the magnetic field coupling between the inductors was set to −60 dB. The embodiment obtained a lowest value of gain that was higher than that in the comparative example, and thus the clock noise of the CDR can be suppressed. In FIG. 16, the magnetic field coupling between the inductors was set to −40 dB. From the gain characteristics in FIG. 16, it is understand this embodiment can maintain the gain more than the comparative example even if the inductor center distance is shortened. Consequently, the embodiment can shorten the inductor center distance even if crosstalk XT exists, and thus the size of the circuit can be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A quadrature oscillation circuit comprising
a plurality of adjacent quadrature oscillators, wherein
a first quadrature oscillator in the quadrature oscillators includes
a first I-phase inductor,
a first Q-phase inductor, and
a first drive circuit that generates a first I-phase current passing through the first I-phase inductor and a first Q-phase current passing through the first Q-phase inductor such that phases of a first I-phase differential signal output from both sides of the first I-phase inductor and phases of a first Q-phase differential signal output from both sides of the first Q-phase inductor are different from each other, a second quadrature oscillator in the quadrature oscillators includes a second I-phase inductor, a second Q-phase inductor, and a second drive circuit that generates a second I-phase current passing through the second I-phase inductor and a second Q-phase current passing through the second Q-phase inductor such that phases of a second I-phase differential signal output from both sides of the second I-phase inductor and phases of a second Q-phase differential signal output from both sides of the second Q-phase inductor are different from each other, and the second drive circuit generates the second Q-phase current whose phase is inversed with respect to the phase of the first Q-phase current when the first I-phase current and the second I-phase current are in phase, and generates the second I-phase current whose phase is inversed with respect to the phase of the first I-phase current when the first Q-phase current and the second Q-phase current are in phase.

2. The quadrature oscillation circuit according to claim 1, wherein the first drive circuit delays the phase of the first Q-phase current with respect to the phase of the first I-phase current such that the phases of the first Q-phase differential signal are delayed with respect to the phases of the first I-phase differential signal, and the second drive circuit advances the phase of the second Q-phase current with respect to the phase of the second I-phase current such that the phases of the second Q-phase differential signal are advanced with respect to the phases of the second I-phase differential signal.

3. The quadrature oscillation circuit according to claim 1, wherein the first I-phase inductor and the second I-phase inductor are symmetric with respect to a line and the first Q-phase inductor and the second Q-phase inductor are symmetric with respect to a line.

4. The quadrature oscillation circuit according to claim 1, wherein the first I-phase inductor and the second I-phase inductor are disposed such that the axis directions are parallel to each other and the first Q-phase inductor and the second Q-phase inductor are disposed such that the axis directions are parallel to each other.

5. A clock and data recovery (CDR) circuit comprising:

a plurality of adjacent quadrature oscillators; and a plurality of CDR parts in the respective quadrature oscillators, wherein each of the CDR parts recovers, from a data signal including superimposed clocks, the clocks and data in accordance with a four-phase signal output from a corresponding quadrature oscillator, a first quadrature oscillator in the quadrature oscillators includes a first I-phase inductor, a first Q-phase inductor, and a first drive circuit that generates a first I-phase current passing through the first I-phase inductor and a first Q-phase current passing through the first Q-phase inductor such that phases of a first I-phase differential signal output from both sides of the first I-phase inductor and phases of a first Q-phase differential signal output from both sides of the first Q-phase inductor are different from each other, a second quadrature oscillator in the quadrature oscillators includes a second I-phase inductor, a second Q-phase inductor, and a second drive circuit that generates a second I-phase current passing through the second I-phase inductor and a second Q-phase current passing through the second Q-phase inductor such that phases of a second I-phase differential signal output from both sides of the second I-phase inductor and phases of a second Q-phase differential signal output from both sides of the second Q-phase inductor are different from each other, and the second drive circuit generates the second Q-phase current whose phase is inversed with respect to the phase of the first Q-phase current when the first I-phase current and the second I-phase current are in phase, and generates the second I-phase current whose phase is inversed with respect to the phase of the first I-phase current when the first Q-phase current and the second Q-phase current are in phase.

6. The CDR circuit according to claim 5, wherein the first drive circuit delays the phase of the first Q-phase current with respect to the phase of the first I-phase current such that the phases of the first Q-phase differential signal are delayed with respect to the phases of the first I-phase differential signal, and the second drive circuit advances the phase of the second Q-phase current with respect to the phase of the second I-phase current such that the phases of the second Q-phase differential signal are advanced with respect to the phases of the second I-phase differential signal.

7. The CDR circuit according to claim 5, wherein the first I-phase inductor and the second I-phase inductor are symmetric with respect to a line and the first Q-phase inductor and the second Q-phase inductor are symmetric with respect to a line.

8. The CDR circuit according to claim 5, wherein the first I-phase inductor and the second I-phase inductor are disposed such that the axis directions are parallel to each other and the first Q-phase inductor and the second Q-phase inductor are disposed such that the axis directions are parallel to each other.

* * * * *